Aug. 26, 1969 D. J. ASENBAUER 3,463,343

ADJUSTABLE CIRCUIT BOARD BOX

Filed Aug. 28, 1967 6 Sheets-Sheet 1

INVENTOR.
DONALD J. ASENBAUER

BY Beehler & Arant

ATTORNEYS

ADJUSTABLE CIRCUIT BOARD BOX

INVENTOR
DONALD J. ASENBAUER

BY Beehler & Arant

ATTORNEYS

ADJUSTABLE CIRCUIT BOARD BOX

INVENTOR.
DONALD J. ASENBAUER
BY
Buehler & Arnett
ATTORNEYS

ADJUSTABLE CIRCUIT BOARD BOX

Filed Aug. 28, 1967

INVENTOR.
DONALD J. ASENBAUER
BY Beehler & Arant
ATTORNEYS

ADJUSTABLE CIRCUIT BOARD BOX

Filed Aug. 28, 1967 6 Sheets-Sheet 5

INVENTOR.
DONALD J. ASENBAUER
BY
Beehler & Arant
ATTORNEYS

INVENTOR.
DONALD J. ASENBAUER
BY Beehler & Arant
ATTORNEYS 3,463,343

ADJUSTABLE CIRCUIT BOARD BOX

Donald J. Asenbauer, Whittier, Calif., assignor to Shell Oil Company, New York, N.Y., a corporation of Delaware Filed Aug. 28, 1967, Ser. No. 663,840
Int. Cl. B65d *19/06, 19/12, 19/16*
U.S. Cl. 220—8 19 Claims

ABSTRACT OF THE DISCLOSURE

An adjustable stacking container adaptable for use as a circuit board box, the container including a pair of telescoping container sections having confronting open sides disposed in interfitting relation, whereby the sections may be telescopically adjusted to vary the overall length of the container, connecting means joining the sections for securing the latter in adjusted positions, and stacking shoulders on the sections to permit a number of the containers, when adjusted to approximately the same overall length, to be stacked one on top of the other.

BACKGROUND OF THE INVENTION

Field of the invention.—This invention relates generally to containers and more particularly to a novel stacking container which is adjustable in size and uniquely adaptable for use an as electrical circuit board box.

As will appear from the later description, the adjustable stacking container of the invention may be designed for a variety of article handling applications. In its broader aspects, then, the invention provides a general purpose container which is characterized by certain unique features of construction and adjustment, whereby the container may be adjusted in size to suit each particular application and stacked with other similar containers. However, the invention is concerned primarily with one particular application of the container which involves the handling of electrical circuit boards, circuit board assemblies, and the like during manufacture, storage, and shipment. For this reason, the invention will be disclosed in connection with this particular application.

Prior art.—Efficient handling of electrical circuit boards, circuit board assemblies, and the like during manufacture, storage, and shipment presents three basic requirements. First, electrical circuit boards are mass produced in large quantities. As a consequence, efficient handling of such boards requires temporary containment of the boards during manufacture and prolonged containment of the boards during storage and shipment with as high storage density as possible. That is to say, the greatest number of circuit boards must be contained within the smallest possible storage space. Secondly, electrical circuit boards have numerous critical surfaces and elements which are exteremely sensitive and subject to damage by contact with other objects, such as other circuit boards. Accordingly, circuit boards must be contained or stored in such a way as to minimize or eliminate the possibility of mutual contact of the adjacent boards as well as contact of the boards by other objects. Third, circuit boards are fabricated in a wide range of sizes. Efficient handling of such boards, then, dictates the use of containers for the boards which are adjustable to accommodate the wide range of circuit board sizes.

Circuit board containers, or circuit board boxes as they are commonly referred to, have been devised. By way of example, prior art Patent No. 3,014,594 discloses one such circuit board box. This patented box, and the other existing circuit board boxes, while they satisfy to some degree one or more of the three major requirements, just stated, i.e., relatively high density storage, circuit board protection, and adjustability, are characterized by various deficiencies which this invention seeks to overcome. Among the foremost of these deficiencies are excessive complexity and cost of manufacture, total lack of or inferior stacking capability, inadequate protection of the contained circuit boards, limited size adjustment, excessive overall size and weight, and others.

SUMMARY OF THE INVENTION

The present invention provides an adjustable container which may be adapted for use as an electrical circuit board box and which, when so adapted, is characterized by maximum circuit board storage density, optimum stacking capability, effective circuit board protection, and extensive adjustment to accommodate a wide range of circuit board sizes. The present container or circuit board box is also characterized by simplicity of construction, economy of manufacture, lightweight, compact size, ease of handling, and other desirable features.

To these ends, the invention provides a container including a pair of telescoping container sections which may be adjusted relative to one another to vary the overall length of the container. When the container is adapted for use as a circuit board box, the end walls of the container or box are provided with grooves for receiving opposite ends of the contained circuit boards, whereby the latter are held in spaced relation. Endwise adjustment of the box is effective to accommodate the latter to a wide range of circuit board sizes. A feature of the invention resides in the fact that the telescoping sections of the box have, in addition to their end walls, overlapping side and bottom walls. Circuit boards contained in the box, therefore, are effectively enclosed on all but one side and thereby protected against damage by contact with other objects. Another feature of the invention resides in the connecting means for securing the box sections in selected positions of adjustment. These connecting means are uniquely arranged to provide a maximum range of adjustment of the box length. According to a further feature of the invention, the telescoping sections of the circuit board box may be equipped with stacking shoulders for permitting a number of the boxes, when adjusted to approximately the same length, to be stacked one on top of the other without damaging the contained circuit boards and in such a way as to provide a very stable box stack. A particularly unique and beneficial feature of the invention involves the construction and arrangement of the telescoping box sections, whereby the latter may be conveniently and economically fabricated from plastic by a vacuum forming process. In this regard, it will be seen from the later description that the connecting means, just referred to, are uniquely arranged to provide, in effect, a two stage adjustment of the box length which achieves a maximum overall range of adjustment of the box length without any appreciable weakening of the plastic box sections. The present circuit board box is thus characterized by simplicity of construction, economy of manufacture, and lightweight. An additional feature of one disclosed form of the circuit box resides in a removable partition or insert which may be employed with relatively small circuit boards to permit containment of such boards in a box which cannot normally be telescoped sufficiently to accommodate the boards.

At this point, attention is again directed to the fact that while the adjustable container of the invention is disclosed herein in connection with its use as an adjustable circuit box, the container may be adapted for other article handling applications. It should be recognized, therefore, that in its broader aspects, the invention provides an adjustable general purpose container and in its more limited aspects an adjustable circuit board box.

DESCRIPTION OF THE PREFERRED EMBODIMENTS

Figure 1:
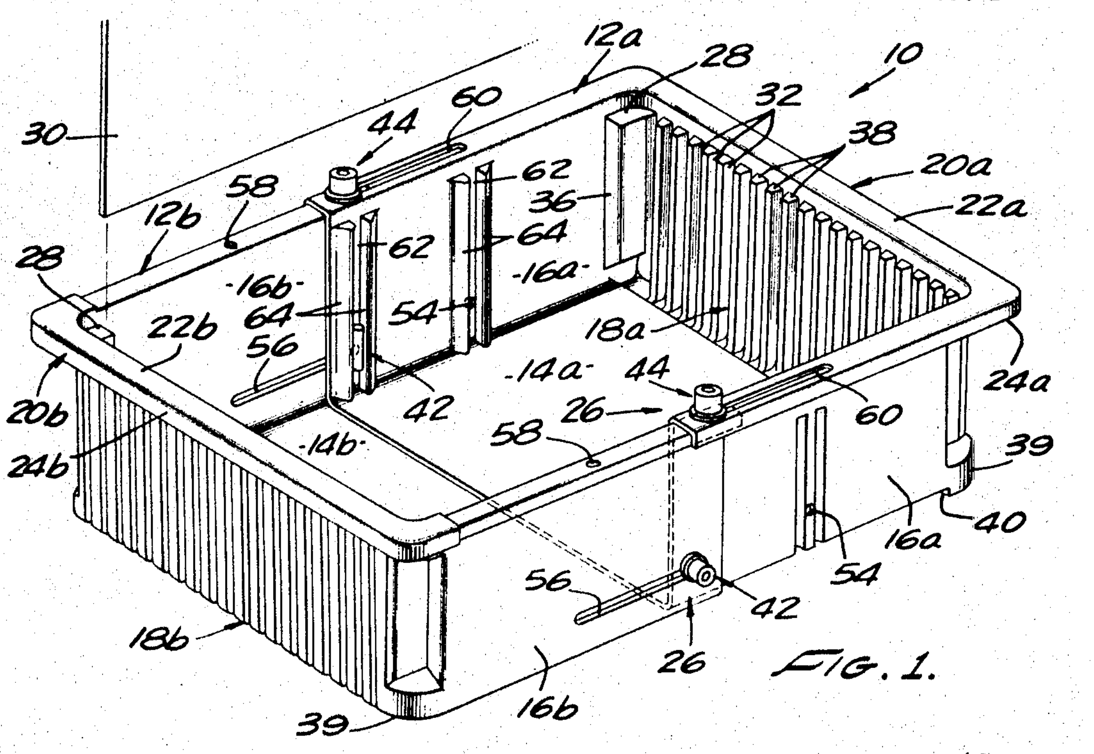
FIGURE 1 is a perspective view of a present adjustable circuit board box.
Figure 2:
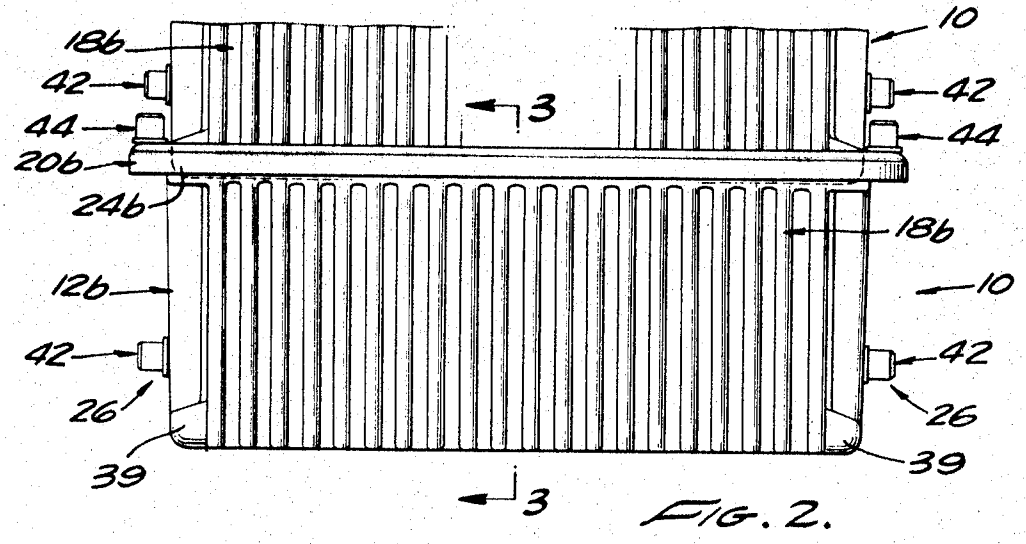
FIGURE 2 is an end elevation of two circuit board boxes stacked one on top of the other.

In general terms, the invention provides an adjustable container, represented in FIGURES 1 through 9 by the container 10, having two similar telescoping sections **12*a* and 12*b*. Container section 12*a* has a generally rectangular bottom wall 14*a* bounded along two opposite edges by upstanding side walls 16*a* and along one remaining edge by an upstanding end wall 18*a*. Along the upper edges of the side and end walls 16*a*, 18*a* is a rim 20*a* including an outwardly directed flange 22*a* terminating along its outer edge in a depending lip 24*a*. Similarly, the container section 12*b* has a rectangular bottom wall 14*b* bounded along two opposite edges by upstanding side walls 16*b* and along one remaining edge by an upstanding end wall 18*b*. Along the upper edges of the side and end walls 16*b*, 18*b* is a rim 20*b* including an outwardly directed flange 22*b* terminating along its outer edge in a depending lip 24*b*. The sides of the container sections 12*a*, 12*b* opposite their end walls 18*a*, 18*b*** are open.

The two container sections **12*a*, 12*b* are disposed in telescoping relation with the open side of section 12*a* fitting slidably within the open side of section 12*b*. Thus, the two container sections are telescopically adjustable to vary the size, and more specifically the length, of the container. Connecting means 26** are provided for releasably securing the container sections in adjusted position.

Formed on the container sections **12*a*, 12*b* are stacking shoulders 28**. These stacking shoulders permit a number of the containers, when adjusted to approximately the same length, to be stacked one on top of the other. When thus stacked, the bottom of each upper container in the stack rests on the stacking shoulders of the adjacent lower container.

It will be recognized that the present container 10, as it is thus far described, may be employed as a general purpose container which may be utilized to advantage in a variety of article handling applications. One feature of this container, of course, is its capability of adjustment to an optimum size for each application. The particular container illustrated, however, is specifically designed for one particular application, to wit, containment of electrical circuit boards 30. In this case, the container is commonly referred to as a circuit board box, and the inner sides of the container or box end walls **18*a*, 18*b* are formed with a number of parallel circuit board receiving grooves 32. The corresponding grooves on the two end walls are located in common longitudinal planes of the box normal to the bottom walls 14*a*, 14*b* of the box sections 12*a*, 12*b*. The circuit boards 30 are placed in the box by inserting the ends of each board in a pair of aligned grooves 32 and then sliding the board downwardly through the grooves until the bottom edge of the board rests on the bottom walls 14*a*, 14*b*** of the box sections.

According to the present invention the adjustable circuit board box 10 is constructed and arranged to firmly hold the circuit boards 30 in such a way that the boards do not contact one another, the boards are shielded against contact by other objects, and the boards are not damaged when stacking a number of the boxes one on top of the other. Contact of the adjacent contained circuit boards is prevented by laterally dimensioning the box end wall grooves 32 to receive the circuit board ends with a relatively close fit and by properly spacing the grooves to maintain at least a slight clearance between the adjacent boards. It will be understood, of course, that the box is adjusted in length to enable proper engagement of the circuit board ends in the grooves. Maximum protection of the circuit boards against damage by other objects is furnished by the bottom, side, and end walls **14*a*, 14*b*, 16*a*, 16*b*, 18*a*, 18*b*, which overlap one another so as to completely surround the contained boards on all sides except the top. As a consequence, the contained circuit boards are exposed only at the open top of the box. Protection of the contained circuit boards against damage when stacking a number of boxes one on top of the other is afforded by longitudinally dimensioning the circuit board grooves 32 so that the upper edges of the boards will be located substantially flush with or slightly below the upper ends of the grooves and locating the stacking shoulders 28** in a common plane substantially flush with or slightly above the upper ends of the grooves.

Referring now in greater detail to the adjustable circuit board box 10 of the invention which has been selected for illustration in the drawings, the box sections **12*a*, 12*b* have relatively thin walls of generally uniform wall thickness and are designed to be conveniently and economically fabricated from plastic by a vacuum forming process. In this regard, it will be observed that the stacking shoulders 28 are integrally formed on the box sections 12*a*, 12*b* at the four-cornered junctures of their side and end walls 16*a*, 16*b*, 18*a*, 18*b*. This is achieved by shaping the molding dies in which the boxed sections are formed to produce vertically elongated indentations in the outer sides of the corners of the box sections and correspondingly elongated stacking posts 36 at the inner sides of the corners. The flat surfaces of these posts are located in a common plane parallel to the bottom walls 14***a*, 14*b* of the box sections and constitute the stacking shoulders 28. The circuit board receiving grooves 32 are integrally formed in the end walls 18*a*, 18*b* of the box sections by shaping the molding dies to provide these walls with a generally corrugated configuration in horizontal section and resulting vertical lands or ribs 38 on the inner sides of the end walls. These ribs define therebetween the grooves 32. The upper ends of the ribs are located substantially in the common plane of the stacking shoulders 28.

It is significant to note here that the stacking shoulders 28 are located somewhat below the level of the rims 20*a*, 20*b* on the box section 12*a*, 12*b*. Accordingly, when a number of the circuit board boxes are stacked one on top of the other, with the bottom of each upper box resting on the stacking shoulders of the adjacent lower box, the bottom of each upper box fits or telescopes a short distance into the open top of the adjacent lower box. For this reason, it is necessary that the side and end walls 16*a*, 16*b*, 18*a*, 18*b* of the box sections taper inwardly at a slight angle toward the bottom of the box, as shown. It will be observed that the lower ends of the stacking posts 36 terminate a distance above the botom walls 14*a*, 14*b* of the box sections 12*a*, 12*b* to provide rounded corner formations 39 below these stacking posts. These corner formations serve as lower stacking shoulders on the box which rest on the upper stacking shoulders 28 of the adjacent lower box in a box stack. It will be immediately evident to those skilled in the art, of course, that other stacking shoulder arrangements may be employed on the present circuit board box. For example, the rims 20*a*, 20*b* of the box sections 12*a*, 12*b* may be recessed to provide a continuous stacking shoulder about the entire circumference of the box. In this case, it may be unnecessary to taper the box walls in the manner illustrated.

As noted earlier and shown in the drawings, the open side of the box section 12*a* fits slidably within the open side of the box section 12*b* to permit telescopic adjustment of the sections. The bottom wall 14*a* of the inner box section 12*a* thus extends over and is located slightly above the level of the bottom wall 14*b* of the outer box section 12*b*. In order to permit both ends of the box to rest firmly on a supporting surface, the upper side of the bottom wall 14*a* of the inner box section 12*a* is recessed along its edge adjacent the inner box section end wall 18*a* to provide at the underside of this section a projecting or depending rib 40. The underside of this rib is flush with the underside of the bottom wall 14*b* of the box section 12*b*. Accordingly, when the box is placed on the supporting surface, the bottom wall 14*b* and the rib 40 rest on the surface.

Figure 7:
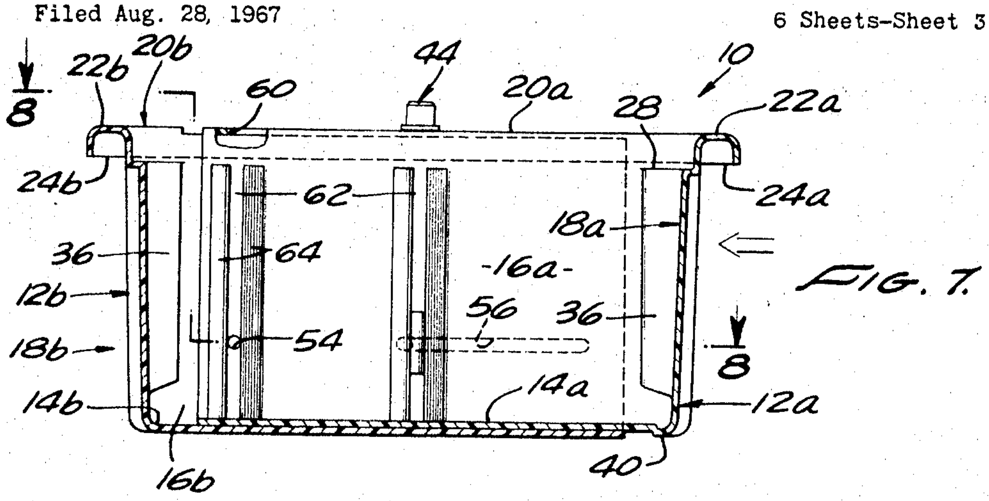
FIGURE 7 is a longitudinal section through the circuit board box when adjusted substantially to its minimum length.

As shown best in FIGURE 1, the box rims 20*a*, 20*b* are disposed in telescoping relation in such a way that the rim 20*a* on the inner box section 12*a* extends over the rim 20*b* on the outer box section 12*b*. Accordingly, the flange 22*a* on the rim 20*a* is located above the level of the flange 22*b* on the rim 20*b*, and the lip 24*a* on the rim 20*a* is located outwardly of the lip 24*b* on the rim 20*b*. For this reason, the portion of the rim 20*b* which extends along the upper edge of the end wall 14*b* on the outer box section 12*b* is raised and extends outwardly slightly at its ends relative to the side portions of the latter rim. The rise and longitudinal extension of the end portion of the rim 20*b* is such that the box, when fully telescoped, has a substantially continuous flush rim about its entire circumference. as shown in FIGURE 7.

Figure 6:
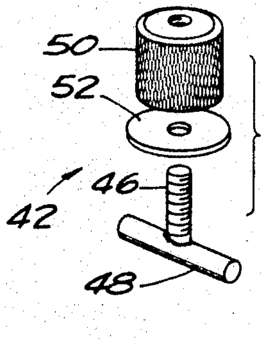
FIGURE 6 is an exploded perspective view of a fastening means which is employed in the circuit board box for securing the telescoping box sections in adjusted position.
Figure 3:
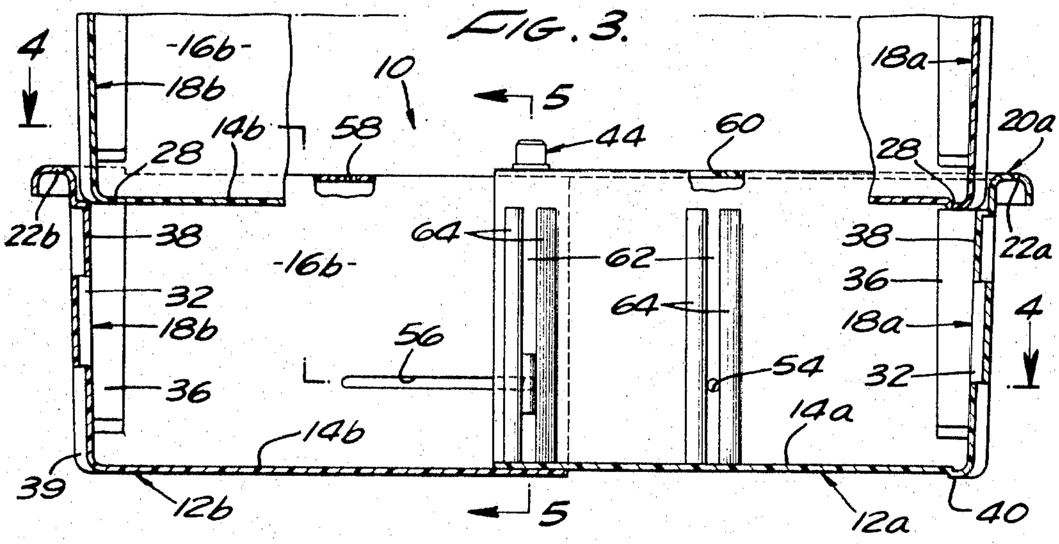
FIGURE 3 is a section taken on line 3—3 in FIGURE 2.
Figure 4:
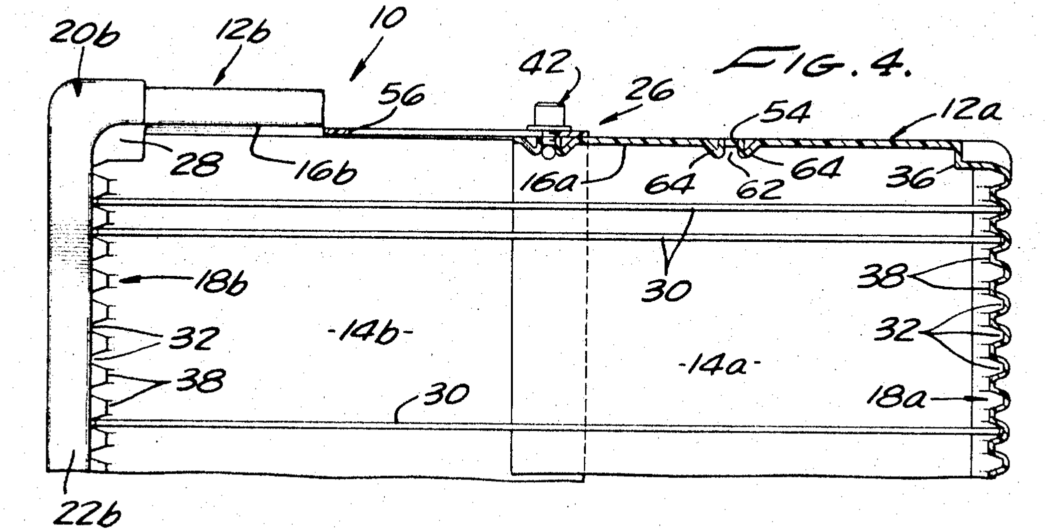
FIGURE 4 is a section taken on line 4—4 in FIGURE 3.

In the adjustable circuit board box 10 under discussion, the connecting means 26 between the box sections 12*a*, 12*b* comprise bolt and slot connections. More specifically, the connecting means comprise a first pair of bolts 42 for joining the overlapping side walls 16*a*, 16*b* of the box sections and a second pair of bolts 44 which join the overlapping rims 20*a*, 20*b* of these sections. The several connecting bolts are identical so that a description of one will suffice for all. Referring to FIGURE 6, illustrating a side wall bolt 42, the latter will be seen to comprise a threaded shank 46 having a cross bar 48 rigid on one end. Threaded on the shank 46 is a knurled nut 50. A washer 52 is positioned on the shank between the cross bar and the nut.

The side wall connecting bolts 42 are inserted through bolt holes 54 in the side walls 16*a* of the inner box section 12*a* and through longitudinal slots 56 in the side walls 16*b* of the outer box section 12*b*. The cross bars 48 of these bolts are located within the box and seat against the inner surfaces of the side walls 16*a*. The nuts 50 of the bolt are located at the outside of the box. The rim connecting bolts 44 extend through bolt holes 58 in the rim flange 22*b* of the outer box section 12*b* and through longitudinal slots 60 in the rim flange 22*a* of the inner box section 12*a*. The cross bars 48 of the latter bolts are located below the rim 20*b*, within the downwardly opening channel defined by the latter rim. The nuts 50 of the bolts 44 are located above the rim 20*a*. In every case, the bolt washers 52 are located between the nuts 50 and the box.

It is evident at this point that the several bolt and slot connections furnished by the connecting means 26 permit telescopic adjustment of the box sections 12*a*, 12*b* to adjust the length of the circuit board box 10. After adjustment, the bolts 42, 44 may be tightened to secure the box sections in adjusted positions relative to one another. One unique feature of the connecting means 26 resides in the side wall slots 56 are formed in outer box section 12*b* and the rim slots 60 are formed in the inner box sections 12*a*. This slot arrangement minimizes weakening of the box sections by the slot. According to another feature of the connecting means, the side walls 16*a* of the inner box section 12*a* are provided with two sets of bolt holes 54 and the rim 20*b* of the outer box section 12*b* is provided with two sets of bolt holes 58. These bolt hole sets are spaced longitudinally of the box and are arranged to selectively receive their respective bolts 42, 44. This unique bolt hole and slot arrangement provides the circuit board box 10 with a two stage adjustment. That is to say, selective insertion of the bolts 42, 44 through their respective bolt hole sets 54, 58 provides, in effect, a coarse adjustment of the box length. Relative adjustment of the bolt along their respective slots 56, 60 provides a fine adjustment of the box length. This coarse and fine adjustment of the box length is readily evident from FIGURES 1, 3, 4, 7 and 8 of the drawings. Another advantage of the illustrated bolt and slot arrangement is that it avoids the necesity of forming relatively long slots in the box sections 12*a*, 12*b* to achieve, with a single set of bolt holes for each bolt pair, the same overall range of box length adjustment provided by the illustrated two stage adjustment. Such long slots, of course, might unduly weaken the box sections 12*a*, 12*b*.

Figure 5:
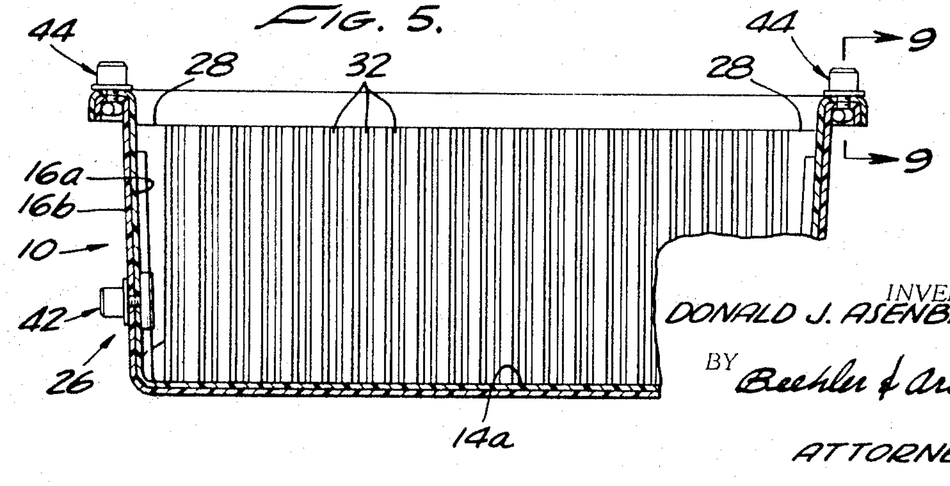
FIGURE 5 is a section taken on line 5—5 in FIGURE 3.
Figure 9:
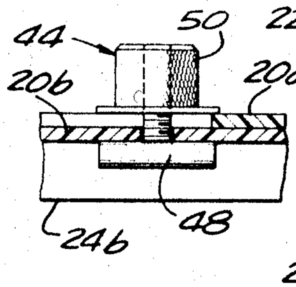
FIGURE 9 is an enlarged section taken on line 9—9 in FIGURE 5.
Figure 8:
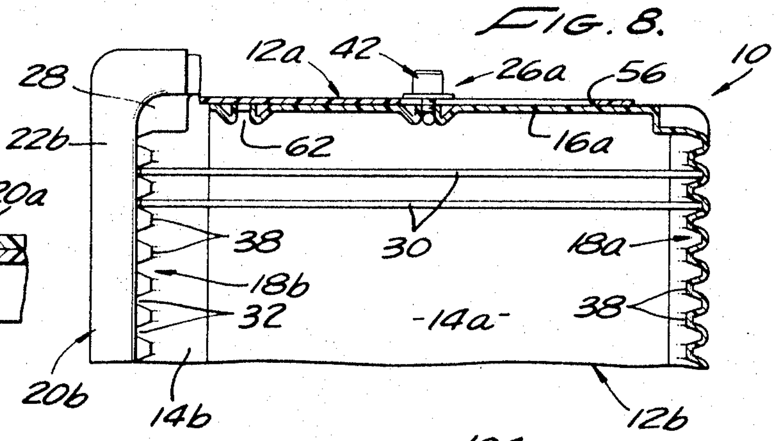
FIGURE 8 is a fragmentary section taken on line 8—8 in FIGURE 7.
Figure 10:
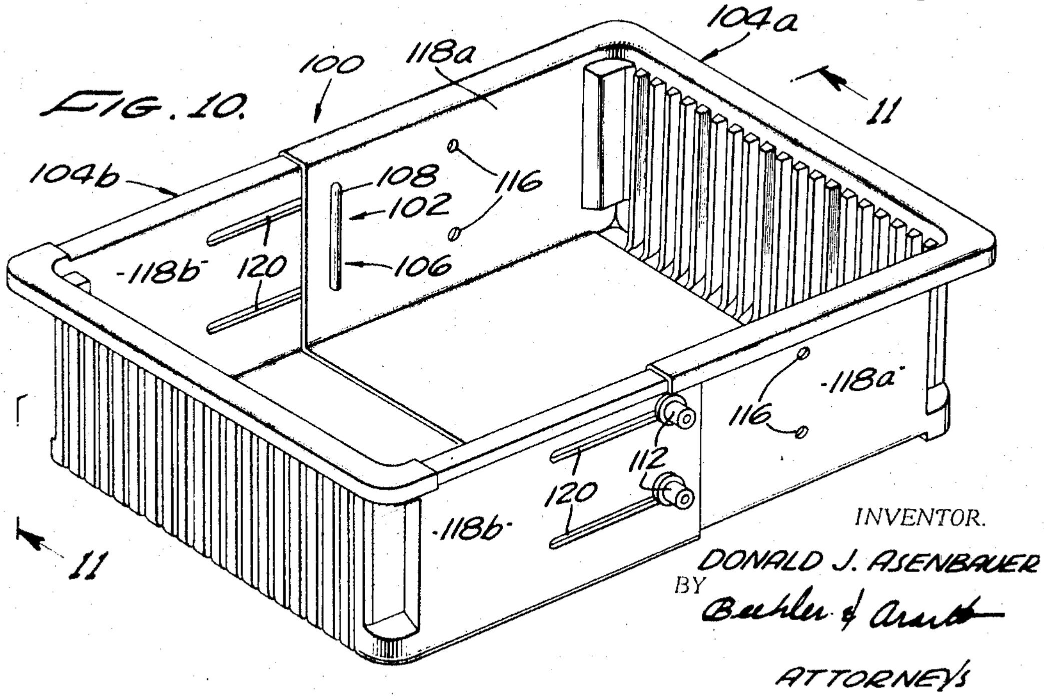
FIGURE 10 is a perspective view of a modified circuit board box according to the invention.
Figure 11:
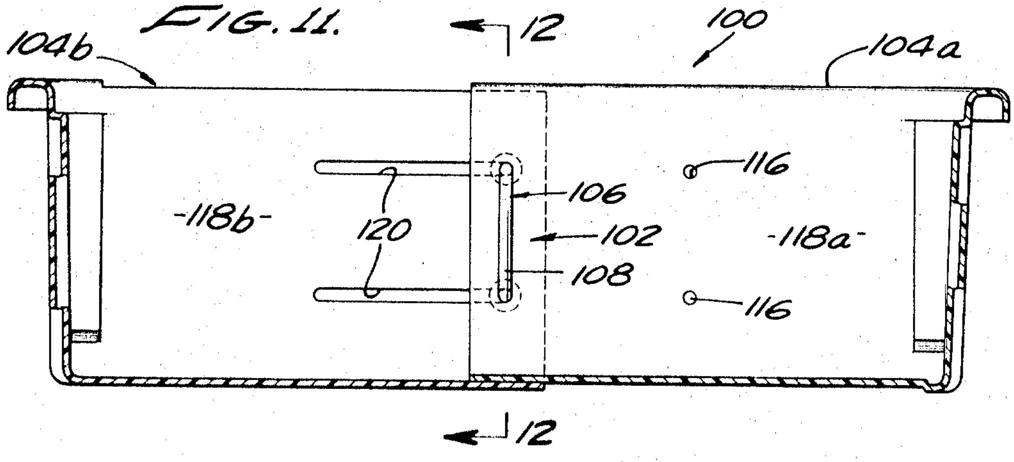
FIGURE 11 is a section taken on line 11—11 in FIGURE 10.
Figure 12:
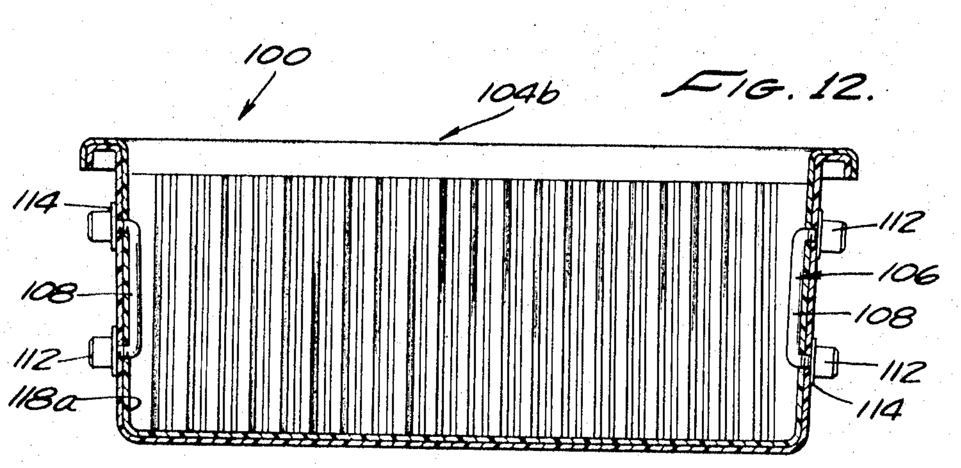
FIGURE 12 is a section taken on line 12—12 in FIGURE 11.
Figures 13, 14:
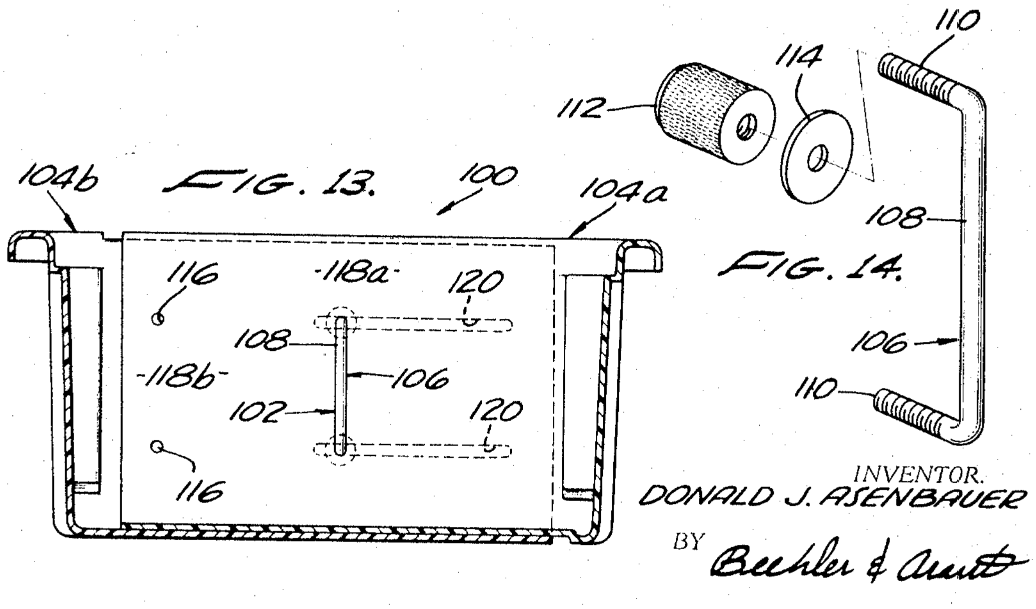
FIGURE 13 is a longitudinal section through the circuit board box of FIGURES 10 through 12 illustrating the box adjusted approximately to its minimum length.
FIGURE 14 is an exploded perspective view of a fastening means employed in the circuit board box of FIGURES 10 through 13 for securing the box sections in adjusted positions.

Another unique feature of the illustrated circuit board box 10 resides in the provision of grooves 62 in the inner sides of the inner box section side walls 16*a* for receiving the cross bars 48 on the side wall connecting bolts 42. Engagement of the cross bars in these grooves prevents the bolts 42 from turning with their nuts 50 when the latter are rotated to release and tighten the bolts. In the particular circuit board box illustrated, the grooves 62 are formed by shaping the forming die for the inner box section 12*a* to produce inwardly projecting ribs 64 on the side walls 16*a*. These ribs define therebetween the grooves 62 and may be laterally elongated, as shown, to serve the additional function of side wall reinforcing ribs. Referring to FIGURES 5 and 9, it will be observed that the rim bolts 44 are restrained against turning with their nuts 50 by virtue of engagement of the cross bars 48 of the bolts in the rim channel of the outer box section 12*b*.

It is now evident that the circuit board box 10 is designed to receive electrical circuit boards 30, or the like, in such a way that the end of the boards fit within the end wall grooves 32 on the box sections 12*a*, 12*b*. These sections may be telescopically adjusted to accommodate the box to a wide range of circuit board sizes. The contained circuit boards are retained in spaced relation so as to be protected against damage by contact with one another. Moreover, the boards are fully enclosed on all sides by the box and are exposed only at the top of the box. As a consequence, the possibility of damage to the boards by contact with other objects is greatly minimized or virtually eliminated. Another advantage of the box is its ability to stack with other light boxes without damaging the contained circuit boards. The box is obviously light in weight, compact in size, economical to manufacture, and easy to handle. Moreover, in contrast to the circuit board container disclosed in the earlier mentioned patent, the external dimensions of the present circuit board box are never any greater than is necessary to accommodate the contained circuit board. As a consequence, the present box does not create any waste space, as does the patented circuit board container just referred to.

FIGURES 10 through 14 illustrate a modified circuit board box 100 according to the invention which is identical to the box just described except for the connecting means 102 which are employed to join the telescoping box sections 104*a*, 104*b*. Accordingly, it is unnecessary to describe the modified box in complete detail. Suffice it to say that the modified connecting means 102 comprise a pair of U-bolts 106 including a connecting bar 108 having bent threaded ends or legs 110, mounting washers 114. The U-bolt legs 110 are inserted through bolt holes 116 in the side walls 118*a* of the inner box section 104*a* and through longitudinal slots 120 in the side walls 118*b* of the outer box sections 104*b*. The U-bolt connecting bars 108 seat against the inner sides of the walls 118*a*. The U-bolt washers and nuts 112, 114 are located at the outside of the box. As in the previous adjustable circuit board box of the invention, the modified circuit board box 100 has two sets of bolt holes 116 in the inner box section side walls 118*a* through which the U-bolts 106 may be selectively inserted.

It is now evident, therefore, that the modified circuit board box 100 may be adjusted in length by loosening the bolts 106 and telescopically adjusting the box sections 104*a*, 104*b*. The box sections are secured in adjusted positions by tightening the U-bolts 106. The multiple bolt hole sets 116 obviously provide the modified circuit board box with the same desirable two stage adjustment, and its attendant advantages, as the earlier box. It is significant to note that there is no need to restrain the U-bolts 106 against turning when their nuts 114 are released and tightened. Accordingly, the side wall ribs and grooves 62, 64 embodied in the earlier circuit board box of the invention are eliminated in the modified circuit board box 100. It will be understood, of course, that the modified box contains electrical circuit boards 30 in the same manner as the earlier box. The modified circuit board box also possesses the same advantages of lightweight, economy of manufacture, ease of handling, simplicity of construction, etc., as the earlier box.

Reference is now made to FIGURES 15 through 21 illustrating a circuit board box 200 which is similar to the circuit board box 100, just described, but is slightly modified to contain electrical circuit boards of a greater range of sizes. Thus, the box 200 is designed to contain electrical circuit boards of the same range of sizes as the box 100 as well as relatively small circuit boards 30*a* which are too small to be contained in the box 100, even when the latter box is telescoped to its minimum length.

The modified circuit board box 200 is identical, in most respects, to the circuit board box 100. Accordingly, it is unnecessary to describe the box 200 in complete. Suffice it to say that one difference between the two boxes resides in the fact that the side walls 202*a* of the inner telescoping box section 204*a* are inset along their lower edges and adjacent the open side of the latter section to form longitudinally extending shoulders or ledges 206 of the inner sides of the latter walls. Ledges 206 have inner surfaces 208 which incline inwardly at a small angle in the upward direction, as may be best observed in FIGURE 21. The angle of inclination of the ledge surfaces 208 is such that the horizontal dimension or overhang Y of each surface approximates the wall thickness of the box sections 204*a*, 204*b*. Another difference between the circuit board box 200 and the earlier circuit board box 100 is that the bottom walls 210*a*, 210*b* of the box sections 204*a*, 204*b* are formed with slightly raised ribs 212 adjacent the box section end walls 214*a*, 214*b*.

When the modified circuit board box 200 is to receive circuit boards of normal length, the box is adjusted and the boards are placed in the box in the same manner as in the earlier embodiments of the invention. The box 200 is conditioned to receive the relatively small circuit boards 30*a* by placing a center partition or insert 216 within the box, in the region between the inner box ledges 206. As shown best in FIGURE 16, this insert comprises, essentially, a wall 218 formed on opposite sides with spaced parallel projecting ribs 220. Ribs 220 define therebetween circuit board receiving grooves 222. The circuit board grooves 222 on each side of the wall 218 are equal in number to the circuit board grooves 224 on each of the box end walls 214*a*, 214*b*. Moreover, the grooves 222 are arranged to be located in common planes with the corresponding end wall grooves 224 when the insert 216 is positioned within the circuit board box 200. Joined to and extending along the two end edges and the bottom edge of the insert wall 218 is a relatively wide flange 226. The vertical ends of the flange 226 have lower portions 228 which slope outwardly, in the downward direction, at the same angle as the inner surfaces 208 of the ledges 206 in the circuit board box 200. The upper portions 230 of the vertical flange ends slope outwardly at small angles in the upward direction and are stepped outwardly at their upper extremities to form seating shoulders 232.

Figure 15:
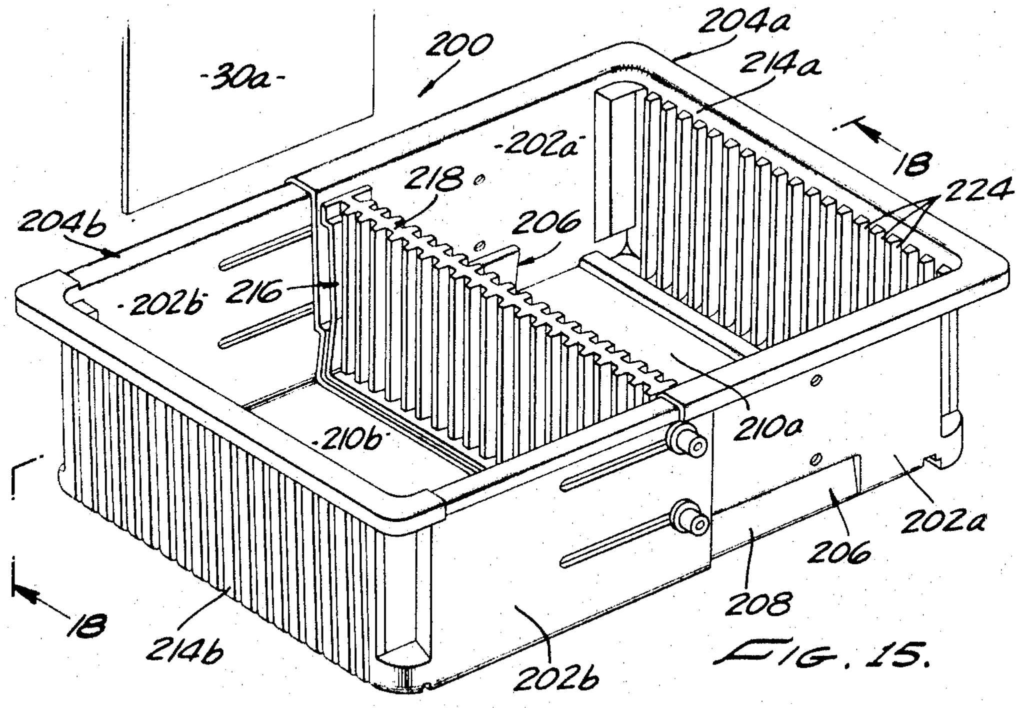
FIGURE 15 is a perspective view of a further modified circuit board box according to the invention having a center partition or insert which accommodates the box to contain relatively small circuit boards.
Figure 21:
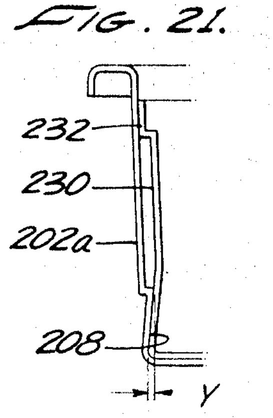
FIGURE 21 is a fragmentary section illustrating certain means which are embodied in the circuit board box of FIGURES 15 through 19 for releasably retaining the center insert in position.
Figure 16:
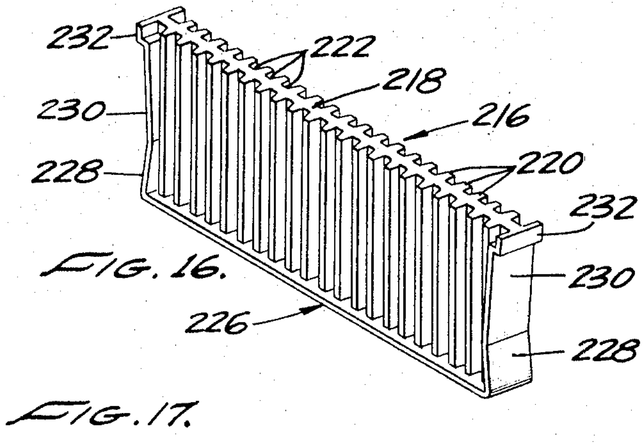
FIGURE 16 is a perspective view of the insert.
Figure 17:
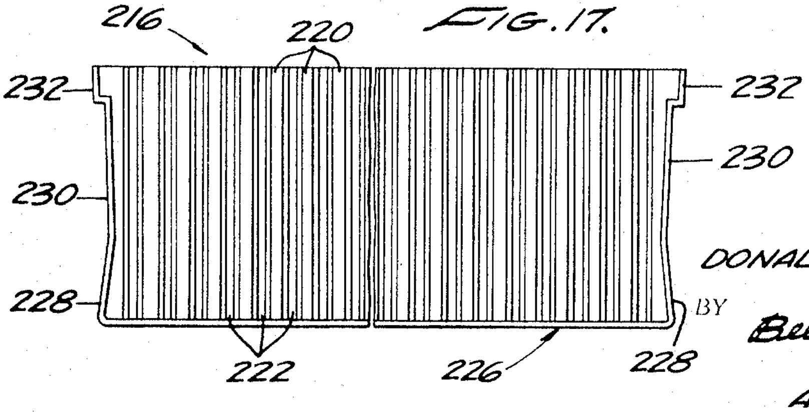
FIGURE 17 is an enlarged side elevation of the insert.
Figure 18:
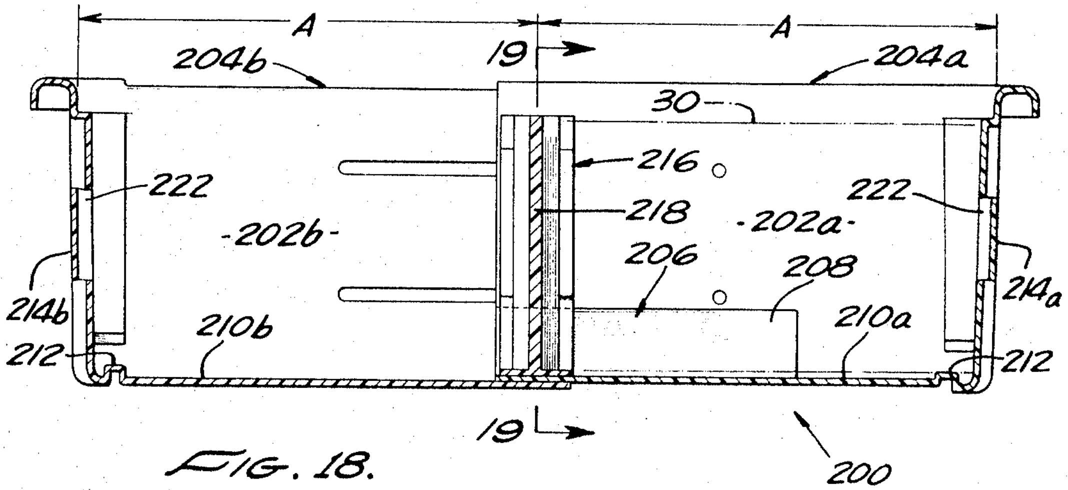
FIGURE 18 is a section taken on line 18—18 in FIGURE 15.
Figure 19:
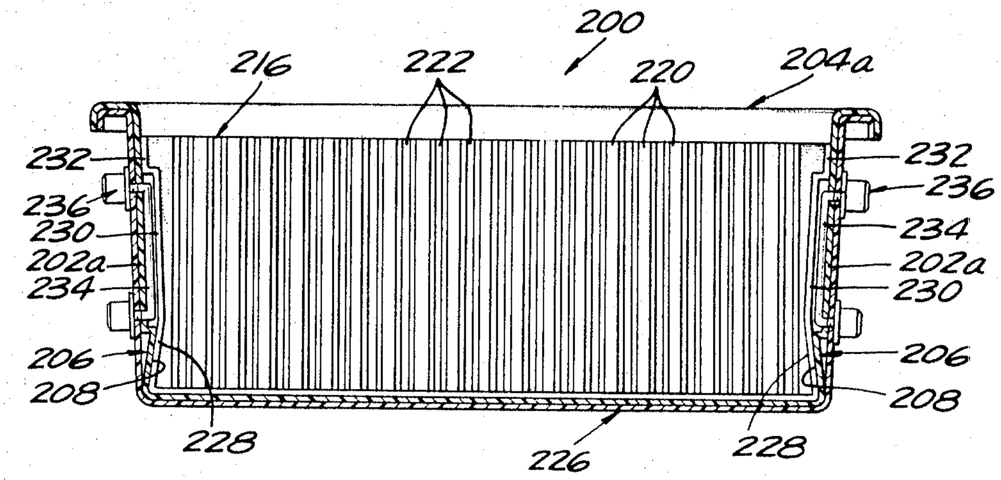
FIGURE 19 is a section taken on line 19—19 in FIGURE 18.
Figure 20:
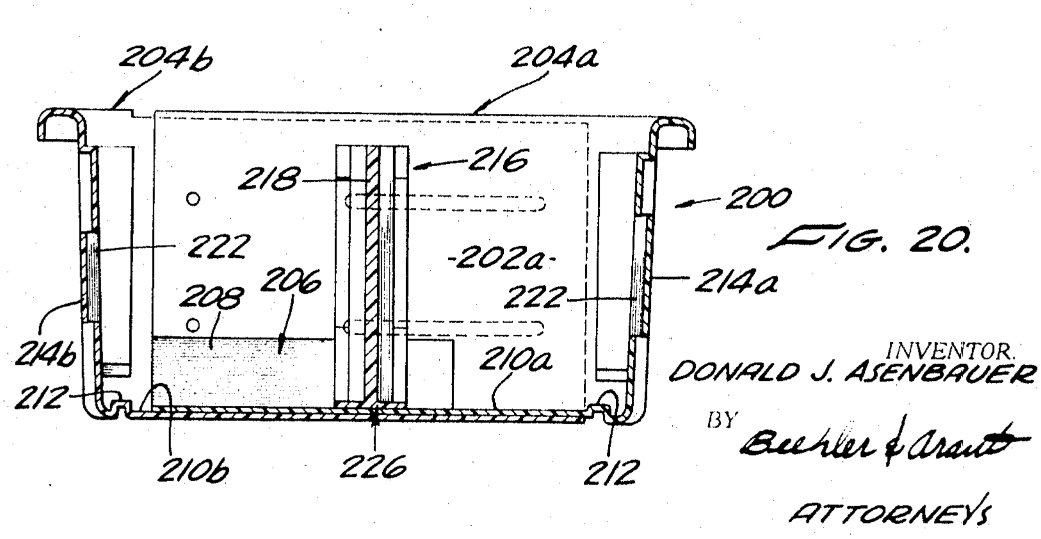
FIGURE 20 illustrates the circuit board of FIGURES 15 through 19 adjusted approximately to its minimum length.

The center partition or insert 216 is longitudinally dimensioned to fit within the open side of the inner circuit board box section 204*a* in the manner best illustrated in FIGURES 15, 19 and 21. It will be observed that when the insert is placed in the box, the lower sloping end portions 228 of the insert flange 226 seat against the inner surfaces 208 of the box ledges 206, and the upper shoulder formations 232 on the insert flange seat against the side wall 202*a* of the inner box section 204*a*. The insert is longitudinally dimensioned to have a snug fit between the ledges and the side walls. In this regard, it will be observed in FIGURE 21 that the overhang Y of the contacting ledge surfaces 208 and insert flange portions 228 is effective to firmly restrain the insert 216 against upward separation from the box. The insert may be installed in the box in either of two ways. Thus, the insert may be lowered edgewise into the outer box section 204*b* and then moved laterally toward the inner box section 204*a* to its installed position between the ledges 206. Alternatively, the insert may be forced downwardly, in the edgewise direction, between the ledges 206. In this regard, it will be understood that the plastic walls of the box sections 204*a*, 204*b* are sufficiently flexible to enable the insert to be thus forced between the ledges. Referring to FIGURE 19, it will be observed that the upper shoulders 232 on the insert flange 226 serve to space the upper flange end portions 230 from the side walls 202*a* of the inner box section 204*a* sufficiently to clear the inner connecting bars 234 of the U-bolts 236 which join the box sections.

It is now evident that when circuit boards of a size which the circuit board box 200 will accommodate normally, without the insert 216, are to be contained, the insert is removed, and the circuit boards are inserted into the box in the manner explained earlier. When the smaller circuit boards 30*a* are to be placed in the box, the insert 216 is installed in the box. The circuit boards are then inserted into the aligned grooves 222, 224 in the insert and the box end walls 214*a*, 214*b*. In this case, therefore, the box will contain two rows of circuit boards 30*a*, one at either side of the insert. It is obvious, therefore, that the modified circuit board box 200 possesses all the advantages discussed earlier in connection with the previous embodiment of the invention.

At this point, it is significant to recall that the bottom walls 210*a*, 210*b* of the box sections 204*a*, 204*b* have raised shoulders 212 adjacent their ends. The height of the shoulders is such that the upper shoulder surfaces are located in a common plane with the upper surface of the lower flange 226 on the center insert 216. Accordingly, when the circuit boards 30*a* are placed in the box, the ends of the boards may rest flush on the shoulders and insert flange, as indicated in phantom lines in FIGURE 18. When the insert is removed to receive longer circuit boards, the ends of the boards rest on the two box shoulders 212. It will be understood, of course, that the length of the box 200 may be adjusted in the same way as the earlier circuit board boxes of the invention. In the case of the box 200, however, adjustment of the box length effectively adjusts the box dimensions A in FIGURE 18, measured between the box end walls 214*a*, 214*b* and the center insert 216. Referring particularly to FIGURE 19, it will be observed that the end flange portions 228, 230, 232 of the insert are configured to clear the U-bolts 234 which join the box sections.

The center insert 216 may be fabricated in various ways. The illustrated insert, for example, may be injection molded from plastic. Alternatively, the insert may be split into two halves along a longitudinal plane of symmetry passing through the insert wall 218, midway between the grooved sides thereof. These two insert halves may be vacuum formed like the box sections 204*a*, 204*b* and then cemented together.

A unique feature of all of the described containers or circuit board boxes of the invention resides in the fact that the telescoping rims of the container or box sections reinforce the side walls of these sections against lateral deflection at every position of adjustment of the sections.

Another feature of the invention resides in the fact that the connecting bolts for joining the telescoping sections of the present container or circuit board box are arranged in such a way that these bolts do not interfere with one another when a number of the containers or boxes are stacked. In this regard, attention is directed to FIGURE 2, wherein it will be observed that the side wall connecting bolts 42 on each container or box 10 in a stack are disposed to clear the rim flange connecting bolts 44 of the adjacent lower container or box in the stack.

The invention has been described in considerable detail in order to comply with the patent laws by providing a full public disclosure of at least one of its forms. However, such detailed description is not intended in any way to limit the broad features or principles of the invention, or the scope of patent monopoly to be granted.

Having described the invention, what is claimed as new in support of Letters Patent is:

1. An adjustable container comprising:

a pair of telescoping inner and outer container sections each including a generally rectangular bottom wall bounded along two opposite edges by upstanding side walls and along one remaining edge by an upstanding end wall, whereby each container section has an open side opposite said end wall, said container sections being disposed in interfitting relation with the open side of said inner section fitting slidably within the open side of said outer section, whereby said sections are telescopically adjustable to vary the length of said container, and connecting means releasably joining said container sections for securing said sections in adjusted positions relative to one another, said connecting means comprising longitudinal slots in the side walls of one container section, first bolt holes in the side walls of the other container section which register with said slots, respectively, throughout a first range of relative adjustment of said sections, second bolt holes in the side walls of said other section longitudinally spaced from said first bolt holes which register with said slots throughout a second range of relative adjustment of said sections, and bolts selectively insertable through said holes and slots for clamping the adjacent side walls together to secure said container sections against relative movement.

2. An adjustable container comprising:

a pair of telescoping inner and outer container sections each including a generally rectangular bottom wall bounded along two opposite edges by upstanding side walls and along one remaining edge by an upstanding end wall, whereby each container section has an open side opposite said end wall, said container sections being disposed in interfitting relation with the open side of said inner section fitting slidably within the open side of said outer section, whereby said sections are telescopically adjustable to vary the length of said container, connecting means releasably joining said container sections for securing said sections in adjusted positions relative to one another, said connecting means comprising longitudinal slots in the side walls of one container section, first bolt holes in the side walls of the other container section which register with said slots, respectively, throughout the first range of relative adjustment of said sections, second bolt holes in the side walls of said other container section completely separate from and longitudinally spaced from said first bolt holes which register with said slots throughout the second range of relative adjustment of said section, and bolts selectively insertable through said holes and slots for clamping the adjacent side walls together to secure said container sections against relative movement, said side walls of said inner container section having a pair of projecting ribs on the inner sides of the latter walls at opposite sides of each of said bolt holes, and each said bolt having a threaded shank extending outwardly through its respective bolt hole and the aligned slot in the adjacent side wall of the outer container section, a nut threaded on the outer end of said shank and adapted to be tightened against the latter wall, and a cross bar on the inner end of said shank engaging between the adjacent projecting ribs on the inner container section to restrain said shank against turning.

3. An adjustable container comprising:

a pair of telescoping inner and outer container sections each including a generally rectangular bottom wall bounded along two opposite edges by upstanding side walls and along one remaining edge by an upstanding end wall, whereby each container section has an open side opposite said end wall, said container sections being disposed in interfitting relation with the open side of said inner section fitting slidably within the open side of said outer section, whereby said sections are telescopically adjustable to vary the length of said container, connecting means releasably joining said container sections for securing said sections in adjusted positions relative to one another, said connecting means comprising longitudinal slots in the side walls of one container section, first bolt holes in the side walls of the other container section which register with said slots, respectively, throughout the first range of relative adjustment of said sections, second bolt holes in the side walls of said other container section completely separate from and longitudinally spaced from said first bolt holes which register with said slots throughout the second range of relative adjustment of said section, and bolts selectively insertable through said holes and slots for clamping the adjacent side walls together to secure said container sections against relative movement, each of said container sections having an upper rim including an outwardly directed flange along the upper edges of the side and end walls of the respective section and a depending lip along the outer edge of said flange, whereby said rim defines a downwardly opening channel, the side portions of the rim of said outer container section fitting slidably within the channel in the side portions of the rim on said inner container section such that said interfitting side rim portions reinforce said side walls against lateral deflection, and said connecting means comprising longitudinal rim slots in the flange of said side rim portions on one container section, first bolt holes in said flange of said side rim portions on the other container section which register with said rim slots, respectively, throughout a first range of relative adjustment of said sections, and second bolt holes in said latter flange which register with said rim slots, respectively, throughout a second range of relative adjustment of said sections, and bolts selectively insertable through said bolt holes and slots for releasably securing said container sections in adjusted position relative to one another.

4. An adjustable container according to claim 3 wherein:

said bolts comprise threaded shanks extending upwardly through said bolt holes and slots, respectively, nuts threaded on said shanks above said rims, and cross bars rigid on the lower ends of said shanks within said channels for restraining said bolts against turning.

5. An adjustable container according to claim 4 wherein:

said one container section is said inner section, and said connecting means further comprise longitudinal slots in the side walls of said outer container section, first bolt holes in the side walls of said inner container section which register with said side wall slots, respectively, throughout a first range of relative adjustment of said sections, second bolt holes in the side walls of said inner container section which register with said side wall slots throughout a second range of relative adjustment of said sections, and bolts having threaded shanks selectively insertable through said side wall bolt holes and slots, cross bars on the inner ends of said shanks seating against the inner surfaces of said inner sections side walls, and nuts threaded on the outer ends of said latter shanks.

6. An adjustable container comprising:

a pair of telescoping inner and outer container sections each including a generally rectangular bottom wall bounded along two opposite edges by upstanding side walls and along one remaining edge by an upstanding end wall, whereby each container section has an open side opposite said end wall, said container sections being disposed in interfitting relation with the open side of said inner section fitting slidably within the open side of said outer section, whereby said sections are telescopically adjustable to vary the length of said container, connecting means releasably joining said container sections for securing said sections in adjusted positions relative to one another, and stacking shoulders on said container sections, respectively, whereby a number of said containers when adjusted to approximately the same overall length may be stacked one on top of the other, the stacking shoulders on said outer container section being located in a plane parallel to and a given distance above the bottom wall of said outer section, and the stacking shoulders on said inner container section being located in a plane parallel to the bottom wall of said inner section and disposed above the latter wall a distance approximately equal to said given distance minus the thickness of said latter wall, whereby said planes approximately coincide.

7. An adjustable container according to claim 6 wherein:

said stacking shoulders comprise upper inner upwardly presented stacking shoulders at the four inner corners, respectively, of said container sections adjacent the open top of said container, lower outer downwardly presented stacking shoulders at the four outer corners, respectively, of said container sections below said upper shoulders, whereby when a number of said containers are stacked, the bottom of each upper container fits within the top of the adjacent lower container and the lower stacking shoulders on each upper container rest on the upper stacking shoulders of the adjacent lower container.

8. An adjustable circuit board box comprising:

a pair of telescoping inner and outer sections each including a generally rectangular bottom wall bounded along two opposite edges by upstanding side walls and along one remaining edge by an upstanding end wall, whereby each section has an open side opposite said end wall, said section being disposed in interfitting relation with the open side of said inner section fitting slidably within the open side of said outer section, whereby said sections are telescopically adjustable to vary the length of said box, connecting means releasably joining said sections for securing said sections in adjusted position relative to one another, stacking shoulders on said sections, respectively, whereby a number of said boxes when adjusted to approximately the same overall length may be stacked one on top of the other, said stacking shoulders comprising upper inner upwardly presented stacking shoulders at the four corners, respectively, of said sections adjacent the open top of said box, lower outer downwardly presented stacking shoulders at the four corners, respectively, of said sections below said upper shoulders, such that when a number of said boxes are stacked, the bottom of each upper box fits within the top of the adjacent lower box and the lower stacking shoulders on each upper box rests on the upper stacking shoulders of the adjacent lower box, said end walls having upright grooves in their inner sides, the corresponding grooves in said end walls being disposed in common longitudinal planes of said box normal to said bottom walls to form groove pairs for receiving opposite ends of electrical circuit boards, said upper stacking shoulders being furnished by upright stacking post formations at the four inner corners of said sections, said stacking post formations terminating a short distance above said bottom walls and the corner portions of said sections below said stacking post formations projecting outwardly to define said lower stacking shoulders, said sections being fabricated from plastic and having a generally uniform wall thickness, and the walls of said box sections being indented at the corners of said sections and along the ends of said sections to define said stacking post formations and said circuit board receiving grooves, respectively.

9. An adjustable electrical circuit board box comprising:

a pair of telescoping inner and outer unitary molded plastic box sections of generally uniform wall thickness throughout each including a generally rectangular bottom wall bounded along two opposite edges by upstanding side walls and along one remaining edge by an upstanding end wall, whereby each box section has an open side opposite said end wall, and a rim along the upper edges of said side and end walls including an outwardly directed flange extending out from said side and end walls and a depending lip along the outer edge of said flange, said box sections being disposed in interfitting relation with the open side of said inner section fitting slidably within the open side of said outer section and the side rim portions on said outer section fitting slidably within the side rim portions on said inner section, whereby said box sections are telescopically adjustable to vary the length of said box, said end walls having upright grooves in their inner sides and the corresponding end wall grooves being disposed in common longitudinal planes of said box normal to said bottom walls to form groove pairs for receiving opposite ends of electrical circuit boards, and connecting means releasably joining said box sections for securing said sections in adjusted positions relative to one another, whereby said box may be adadjusted to receive electrical circuit boards of a range of sizes.

10. An adjustable circuit board box according to claim 9 including:

stacking shoulders on said box sections, respectively, to permit a number of said box sections when adjusted to approximately the same overall length to be stacked one on top of the other, the stacking shoulders on said outer box section being located in a plane parallel to and a given distance above the bottom wall of said outer section, and the stacking shoulders on said inner box section being located in a plane parallel to the bottom wall of said inner section and disposed above the latter wall a distance approximating said given distance minus the thickness of said latter wall, whereby said planes approximately coincide.

11. An adjustable electrical circuit board box comprising:

a pair of telescoping inner and outer unitary molded plastic box sections of generally uniform wall thickness throughout each including a generally rectangular bottom wall bounded along two opposite edges by upstanding side walls and along one remaining edge of an upstanding end wall, whereby each box section has an open side opposite said end wall, and a rim along the upper edges of said side and end walls including an outwardly directed flange extending out from said side and end walls and a depending lip along the outer edge of said flange, said box sections being disposed in interfitting relation with the open side of said inner section fitting slidably within the open side of said outer section and the side rim portions on said outer section fitting slidably within the side rim portions on said inner section, whereby said box sections are telescopically adjustable to vary the length of said box, said end walls having upright grooves in their inner sides and the corresponding end wall grooves being disposed in common longitudinal planes of said box normal to said bottom walls to form groove pairs for receiving opposite ends of electrical circuit boards, connecting means releasably joining said box sections for securing said sections in adjusted positions relative to one another, whereby said box may be adjusted to receive electrical circuit boards of a range of sizes, and said connecting means comprising longitudinal slots in the side walls of said outer box section, first bolt holes in the side walls of said inner box section which register with said slots, respectively, throughout a first range of relative adjustment of said sections, second bolt holes in the side walls of said inner box section which register with said slots throughout a second range of relative adjustment of said sections, longitudinal rim slots in the flange of said side rim portions on said inner box section, first bolt holes in the flange of said side rim portions on the outer box section which register with said rim slots, respectively, throughout said first range of relative adjustment of said sections, second bolt holes in said latter flange which register with said end slots, respectively, throughout said second range of relative adjustment of said sections, and bolts selectively insertable through said bolt holes and aligned slots for releasably securing said box sections in adjusted position relative to one another.

12. An adjustable circuit board box according to claim 11 wherein:

the side walls of said inner box section have inwardly projecting ribs at their inner side and located at opposite sides of said side wall bolt holes, respectively, and the bolts which join said box section side walls comprise inner cross bars engaging between said ribs, respectively, for restraining said bolts against turning.

13. An adjustable circuit board box according to claim 9 wherein:

said connecting means comprise a pair of vertically spaced longitudinal slots in the side walls of said outer box section, first pairs of bolt holes in the side walls of said inner box section which register with said slots, respectively, throughout a first range of relative adjustment of said sections, second pairs of bolt holes in the side walls of said inner box section which register with said slots, respectively, throughout the second range of relative adjustment of said sections, and U-bolts having legs selectively insertable through said bolt holes and slots for securing said box sections against relative adjustment.

14. An adjustable circuit board box according to claim 9 including:

a center insert removably positioned within said box in a plane generally parallel to and located midway between said end walls, respectively, and said insert having circuit board receiving grooves in opposite sides thereof aligned longitudinally of said box with the grooves, respectively, in said end walls, whereby said box is adapted to receive relatively small electrical circuit boards with the ends of each board fitting within the aligned grooves in one box end wall and the adjacent side of said insert.

15. An adjustable electrical circuit board box comprising:

a pair of telescoping inner and outer unitary molded plastic box sections of generally uniform wall thickness throughout each including a generally rectangular bottom wall bounded along two opposite edges by upstanding side walls and along one remaining edge by an upstanding end wall, whereby each box section has an open side opposite said end wall, and a rim along the upper edges of said side end walls including an outwardly directed flange extending out from said side and end walls and a depending lip along the outer edge of said flange, said box sections being disposed in interfitting relation with the open side of said inner section fitting slidably within the open side of said outer section and the side rim portions on said outer section fitting slidably within the side rim portions on said inner section, whereby said box sections are telescopically adjustable to vary the length of said box, said end walls having upright grooves in their inner sides and the corresponding end wall grooves being disposed in common longitudinal planes of said box normal to said bottom walls to form groove pairs for receiving opposite ends of electrical circuit boards, connecting means releasably joining said box sections for securing said sections in adjusted positions relative to one another, whereby said box may be adjusted to receive electrical circuit boards of a range of sizes, and a center insert removably positioned within said box in a plane generally parallel to and located approximately midway between said end walls, respectively, said insert having circuit board receiving grooves on opposite sides thereof aligned longitudinally of said box with the grooves in said end walls, whereby said box is adapted to receive relatively small electrical circuit boards with the ends of each board fitting within the aligned grooves in one box end wall and the adjacent side of said insert, the side walls of said inner box section being formed with inwardly projecting longitudinally extending ledges adjacent the bottom wall of said inner section, the inner surfaces of said ledges converging at a small angle in the upward direction, and said insert fitting snugly between said ledges and having end surfaces which converge in the upward direction at the same angle as said ledge surfaces and are disposed in snug seating engagement with said ledge surfaces, whereby said ledges restrain said insert against upward edgewise separation from said box.

16. A circuit board box according to claim 15 wherein:

said box sections are fabricated from plastic, whereby box section side walls possess a degree of lateral flexibility, and said insert is movable into and from its installed position between said ledges by lateral movement of said insert lengthwise of said ledges into and from said outer box section and vertical edgewise movement of said insert laterally of said ledges.

17. An adjustable circuit board box according to claim 16 wherein:

said connecting means comprise connecting bolts joining said box section side walls in line with said insert and above said ledges, and the ends of said insert above said ledges are spaced from the side walls of said inner box section to provide clearance for said bolts.

18. An adjustable circuit board box according to claim 9 wherein:

a portion of the bottom wall of said inner box section adjacent the end wall of the latter box section is stepped downwardly a distance approximating said wall thickness to define a supporting formation at the underside of said inner box section substantially flush with the underside of the bottom wall of said outer box section.

19. An adjustable circuit board box according to claim 18 wherein:

the rim on said outer box section includes side portions extending along the upper edges of the side walls of said outer section and an end portion extending along the upward edge of the end wall of said outer section, and said end rim portion projecting above said side rim portions a distance approximating said wall thickness, whereby when said box sections are fully telescoped with said end rim portion is substantially flush with the rim on said inner box section to provide an essentially continuous rim about the entire open top of said box.

References Cited

UNITED STATES PATENTS

| | | | |
|---|---|---|---|
| 874,442 | 12/1907 | Sandel | 220—8 |
| 1,120,955 | 12/1914 | Martin | 220—8 X |
| 1,858,179 | 5/1932 | Bay | 220—8 |
| 2,799,424 | 7/1957 | Good | 220—8 |
| 3,069,002 | 12/1962 | Hart | 206—1 |
| 3,311,257 | 3/1967 | Puente | 220—72 |

GEORGE F. LOWRANCE, Primary Examiner

U.S. Cl. X.R.

220—22, 72